United States Patent [19]

Cook et al.

[11] Patent Number: 5,313,481

[45] Date of Patent: May 17, 1994

[54] COPPER LASER MODULATOR DRIVING ASSEMBLY INCLUDING A MAGNETIC COMPRESSION LASER

[75] Inventors: Edward G. Cook, Livermore; Daniel L. Birx, Oakley; Don G. Ball, Livermore, all of Calif.

[73] Assignee: The United States of America as represented by the United States Department of Energy, Washington, D.C.

[21] Appl. No.: 128,185

[22] Filed: Sep. 29, 1993

[51] Int. Cl.$^5$ .......................... H01S 3/00; H01S 3/22
[52] U.S. Cl. ........................ 372/37; 372/38; 372/28; 372/56; 372/81; 372/82
[58] Field of Search ...................... 372/25, 26, 28, 37, 372/38, 55, 56, 57, 73, 74, 81, 82, 108, 109, 76, 87

[56] References Cited

U.S. PATENT DOCUMENTS

| | | | |
|---|---|---|---|
| 3,681,710 | 8/1972 | Lary et al. | 372/37 X |
| 4,080,578 | 3/1978 | Farish et al. | 372/38 X |
| 4,143,337 | 3/1979 | Beaulieu | 372/38 X |
| 4,601,039 | 7/1986 | Sze | 372/38 X |
| 4,604,752 | 8/1986 | Sequin et al. | 372/37 X |
| 4,730,334 | 3/1988 | Collins et al. | 372/37 X |
| 4,748,635 | 5/1988 | McLellan | 372/38 X |
| 4,945,542 | 7/1990 | Brothers Jr. | 372/38 |
| 5,144,193 | 9/1992 | Warren | 372/37 X |
| 5,177,754 | 1/1993 | Ball et al. | 372/38 |
| 5,189,678 | 2/1993 | Ball et al. | 372/28 |
| 5,235,608 | 8/1993 | Konishi | 372/37 |

Primary Examiner—Brian Healy
Attorney, Agent, or Firm—Miquel A. Valdes; Roger S. Gaither; William R. Moser

[57] ABSTRACT

A laser modulator (10) having a low voltage assembly (12) with a plurality of low voltage modules (14) with first stage magnetic compression circuits (20) and magnetic assist inductors (28) with a common core (91), such that timing of the first stage magnetic switches (30b) is thereby synchronized. A bipolar second stage of magnetic compression (42) is coupled to the low voltage modules (14) through a bipolar pulse transformer (36) and a third stage of magnetic compression (44) is directly coupled to the second stage of magnetic compression (42). The low voltage assembly (12) includes pressurized boxes (117) for improving voltage standoff between the primary winding assemblies (34) and secondary winding (40) contained therein.

19 Claims, 7 Drawing Sheets

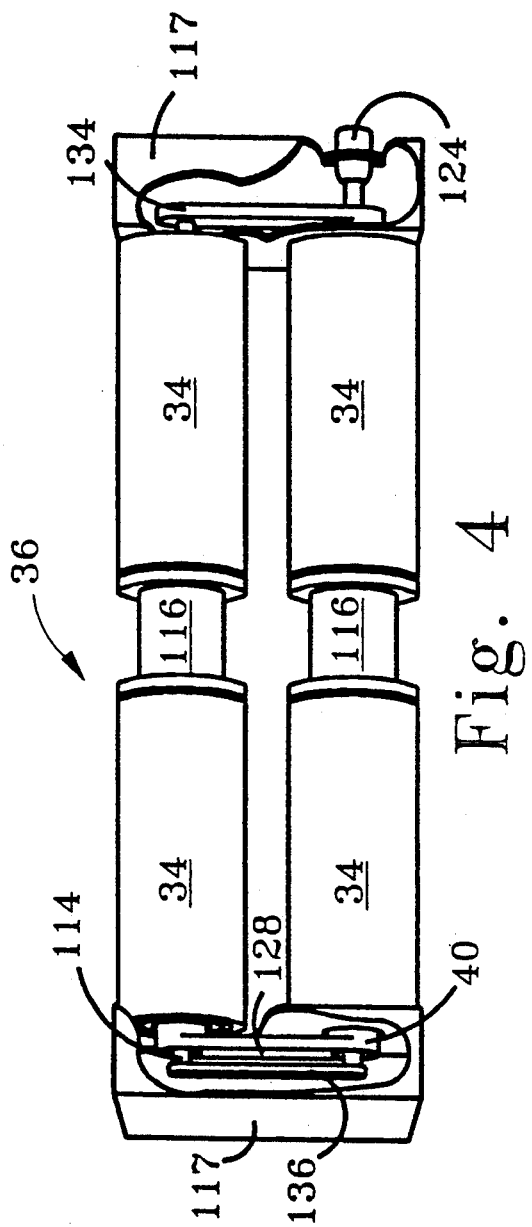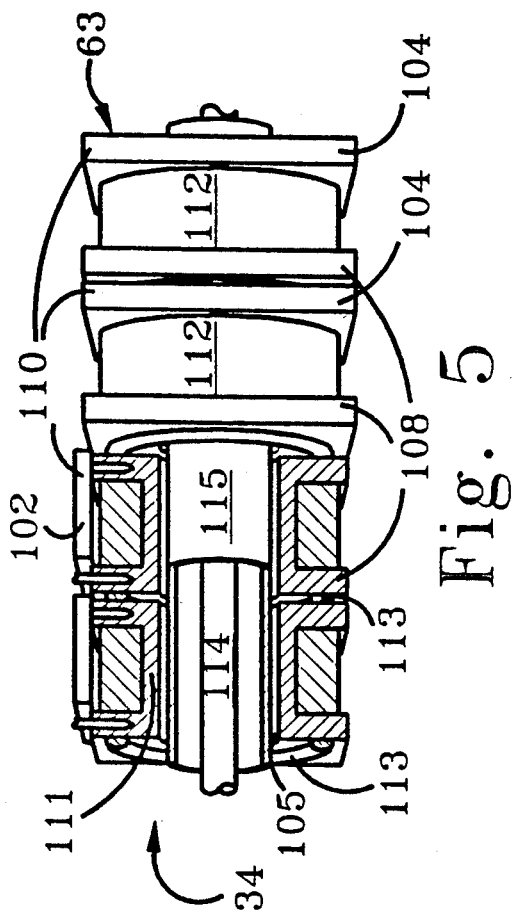

COPPER LASER MODULATOR DRIVING ASSEMBLY INCLUDING A MAGNETIC COMPRESSION LASER

The United States Government has rights in this invention pursuant to Contract No. W-7405-ENG-48 between the United States Department of Energy and the University of a California.

BACKGROUND OF THE INVENTION

The present invention relates generally to electronic power supply devices and more particularly to an improved high average power magnetic modulator for metal vapor lasers.

It has become recognized that pulsed power supplies employing magnetic compression circuits are appropriate for use with high power pulsed lasers. Even though such power supplies are more expensive and more complex than some other known modulator types, the high reliability of magnetic switch modulators is deemed to be necessary for critical applications, and the higher the output power required the greater is the improvement in the reliability of such modulators as compared to more conventional electronic pulsed power supply devices using thyratrons, or the like, as the ultimate switching circuit elements. An example of a particular such magnetic compression laser driving circuit, particularly adapted for high efficiency operation, is found in U.S. Pat. No. 5,177,754 issued to Ball et al..

Due to the fact that high average power magnetic compression laser driving circuits produce a great deal of heat, and further due to the fact that they produce very high voltages, they have been designed to be operated immersed in a liquid dielectric fluid, which fluid acts both to improve voltage hold off and as a coolant. However, known fluorocarbon dielectric fluids which have been used for this purpose present environmental problems, and are becoming unavailable for that reason. Therefore, it is desirable to produce a magnetic compression laser driver circuit which can operate without the use of such fluids. However, efforts to produce a device which can provide the necessary power for those applications which require very high power, without the use of fluorocarbon dielectric and coolant fluid and with the requisite reliability, have been less than completely successful. Primary switching stages using thyratron switches have proven to be less than optimal due the inherently finite life of such switches. Solid state devices have been tried but these generally lack the ability to deliver the instantaneous power and/or rate of change of current necessary for the task.

To the inventors' knowledge, no previous magnetic compression laser driving circuits which can produce the very high power output required by high average power lasers (greater than 30 kW) and which function without the use of fluorocarbon coolants or dielectrics have been known in the prior art. All previous such devices have either required the use of fluorocarbons or else have produced insufficient voltage and/or power output for some applications.

SUMMARY OF THE INVENTION

Accordingly, it is an object of the present invention to provide a long life, high average power laser modulator which can deliver very high voltage and power output.

It is another object of the present invention to provide a laser power modulator which does not require the use of fluorocarbons either as a dielectric or as a coolant.

It is another object of the present invention to provide a high average power modulator which can be readily scaled to higher average power and/or higher output voltages by incorporating additional low voltage modules.

It is still another object of the present invention to provide a laser power modulator which will produce cleanly modulated voltage peaks free of unwanted jitter.

It is yet another object of the present invention to provide a laser power modulator which is reliable in operation, even over extended periods of operation.

Briefly, the present invention is a laser modulator having a plurality (four, in the case of the best presently known embodiment) of first stage magnetic compression laser driving circuits operating simultaneously. The summed energy output of the first stage magnetic compression circuits is coupled to second and third stage magnetic compression circuits. The individual magnetic compression laser driving circuits have a physical layout which provides sufficient cooling using just air, water and oil as coolants. Further, the physical layout of the first stage magnetic compression circuits eliminates the need for immersion in a liquid dielectric. To insure adequate reliability over an extended operating life, solid state switch control devices are used to trigger the four first stage compression circuits. The shortcoming that it has not been possible to provide sufficient power output with these restrictions has been overcome by operating the four first stage magnetic compression circuits simultaneously. Jitter, which is time instability or noise in the output pulses between the inception of output pulses and principle voltage surge, and which would normally result from an attempt to operate such units simultaneously due to inevitable minute differences in the timing of such circuits, is minimized in the present invention by the introduction of a unique inductive component into the first stage circuits which is common to all of the first stage circuits and which, essentially, slaves those circuits together.

An advantage of the present invention is that no fluorocarbons are used.

A further advantage of the present invention is that it will produce low jitter output pulses of very high voltage and instantaneous power.

Still another advantage of the present invention is that it can be readily scaled to higher average power and/or higher output voltages by incorporating additional low voltage modules.

Yet another advantage of the present invention is that it is much smaller and lighter in weight than prior art units of comparable output specifications.

Still another advantage of the present invention is that it operates at a relatively low internal operating temperature.

Yet another advantage of the present invention is that it is rugged and reliable, even over extended periods of operation.

These and other objects and advantages of the present invention will become clear to those skilled in the art in view of the description of the best presently known mode of carrying out the invention and the industrial applicability of the preferred embodiment, as

BRIEF DESCRIPTION OF THE DRAWING

FIG. 4 is a partially cut away perspective view of the bipolar pulse transformer;

FIG. 5 is a partial cut away perspective view of one set of primary windings;

DETAILED DESCRIPTION OF THE INVENTION

The best presently known mode for carrying out the invention is an improved copper laser modulator having multiple first stages. The predominant expected usage of the improved laser modulator is for providing high voltage output pulses to metal vapor lasers, particularly copper vapor lasers, which require very high input voltage pulses.

Figure 1:
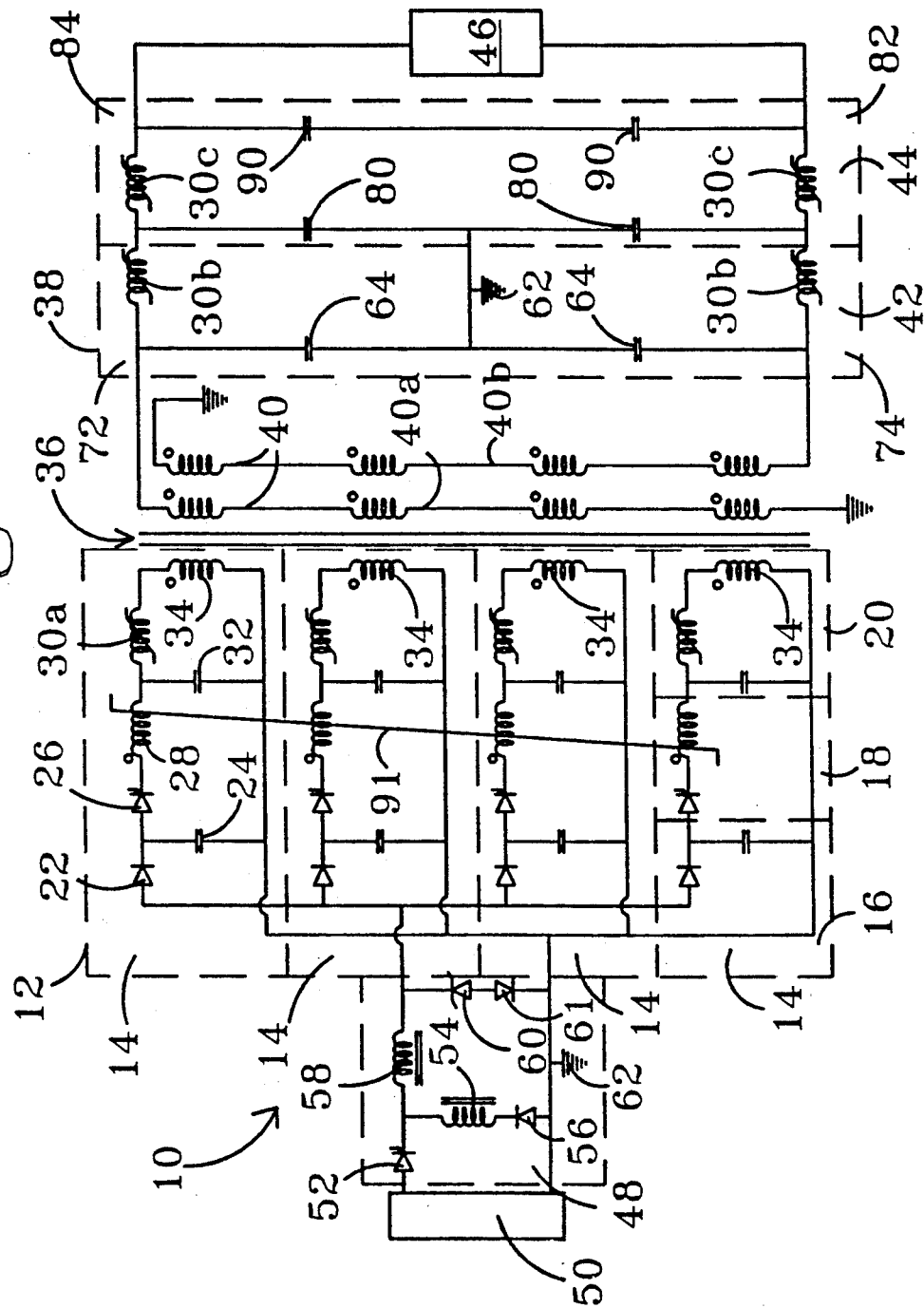
FIG. 1 is a schematic electrical diagram of an improved copper laser modulator according to the present invention.

An improved copper laser modulator is shown in the electrical schematic diagram of FIG. 1 and is designated therein by the general reference character 10. In many respects the improved copper laser modulator 10 is not unlike prior art conventional magnetic compression laser driving circuits. The improved copper laser modulator 10 has a low voltage assembly 12 with a plurality (four, in the example of FIG. 1) of low voltage modules 14. Each low voltage module 14 can be conceptualized has having an input portion 16, a switching portion 18, and a first stage of magnetic compression (first stage) 20. Each of the input portions 16 has an input ("blocking") diode 22 and an input capacitor 24. Each of the switching portions 18 has a main silicon controlled rectifier (SCR) 26 and a magnetic assist inductor 28. Key to the invention are a plurality (the exact quantities to be discussed hereinafter) of nonlinear switching inductors ("magnetic switches") 30. Each of the first stages 20 has a first stage magnetic switch 30a and an associated first stage capacitor 32. In addition, each of the low voltage modules 14 has therein parallel primary winding assemblies 34 of a bipolar pulse transformer 36.

An output assembly 38 is coupled to low the voltage assembly 12 by the bipolar pulse transformer 36. The secondary winding 40 of the transformer 36 is coupled to the primary winding assemblies 34 of each of the four low voltage modules 14 and has a first secondary winding set 40a and a second secondary winding set 40b. The output assembly 38 has a second stage 42 and a third stage 44. The second stage 42 has two second stage magnetic switches 30b, and the third stage 44 has two third stage magnetic switches 30c. As shown in the schematic diagram of FIG. 1 the arrangement of the mechanical and electrical connections of the magnetic switches 30b and 30c cause the second stage 42 and the third stage 44 to be bipolar in nature, as will be discussed in more detail hereafter. The output of the third stage 44 is coupled directly to an object laser 46.

As is shown in FIG. 1, in the preferred embodiment 10 of the present invention, a charging circuit 48 switches power from a power supply 50 to each of the four low voltage modules 14. The charging circuit 48 includes a first SCR 52, an energy recovery inductor 54 and diode 56, a charging inductor 58, a zener diode 60, and a charging circuit series blocking diode 61. In the charging circuit 48 a first SCR 52 acts as a primary switch. (Control circuitry for controlling the switching of the first SCR, is entirely conventional and is not shown in the view of FIG. 1 for the sake of clarity.) A charging inductor 58 limits dI/dt through the first SCR 52 and determines the time required to charge the input capacitor 24 in each low voltage module 14. A zener diode 60 limits voltage at the output of the charging circuit 48 relative to a system ground 62. The series blocking diode 61 prevents current flow in the zener diodes 60 due to inverse voltage on the input portion 16 of each of the low voltage modules 14.

Referring now to the low voltage modules 14, each main SCR 26 acts as the main switch for the first stage magnetic switch 30a of its respective low voltage module 14. The series blocking diode 22 decouples the input portions 16 of the low voltage modules 14 from each other after the main SCR 26 is triggered. The theory and operation of the magnetic switch stages is known in the art, and will not be discussed in detail herein. Copending U.S. Pat. application Ser. No. 07/898,105 (a Continuation In Part of Ser. No. 06/915,197) discusses the nuances of circuit timing for such switches, and is incorporated by reference herein. As one familiar with the operation of magnetic switches will recognize, the input capacitor 24 of each low voltage module 14 is charged by the charging circuit 48 While the main SCR 26 of its respective low voltage module 14 is not conducting. The four main SCR's 26 are triggered by external timing mechanisms (not shown) to initiate simultaneous conduction. Within each of the low voltage modules 14 the magnetic assist inductor 28 serves to delay the rise of current through its respective main SCR 26 thereby reducing power loss, and thus serving to enhance the life of the SCR's 26. On a device-to-device basis SCR's vary slightly in their turn-on characteristics and will not turn on simultaneously even with simultaneous trigger pulses. This will be a source of time jitter, and, as will be discussed in more detail hereinafter, the magnetic assist inductor(s) 28 of the best presently known embodiment of the present invention are key to avoiding timing and jitter problems associated with triggering SCR's and operating the four low voltage modules 14 in parallel.

In the manner conventional to such magnetic switch devices, the first stage magnetic switch 30a and first stage capacitor 32 in each low voltage module 14 compress the energy pulses generated by triggering their respective main SCR's 26; i.e. the energy is transferred out of the capacitor 32 and through the magnetic switch 30a at a faster rate than the energy was initially deposited on capacitor 32 by the triggering of main SCRs 26. As previously discussed, the output of the first stage 20 drives the transformer primary winding assemblies 34 and is therefore coupled to the second stage 42 through the bipolar pulse transformer 36.

Each low voltage module 14 has two primary winding assemblies 34, each consisting of four primary windings 63 mechanically connected together. Electrically, both primary winding assemblies 34 (eight primary windings 63) are connected in parallel and driven simultaneously by the voltage pulse generated by the saturation of the first stage magnetic switch 30a as shown in the schematic of FIG. 1. One primary winding assembly 34 of each low voltage module 14 is magnetically coupled to the positive polarity winding 40a and the other primary winding assembly 34 of each low voltage module 14 is magnetically coupled to the negative polarity winding 40b. In this manner the energy of each low voltage module 14 is coupled into the high voltage circuitry by the summing action of the pulse transformer 36. This has the important implication that a modulator's average power may be increased by the installation of additional low voltage modules 14, and that there will be no fundamental change in the transformer design or the expected lifetime or reliability of the components of the modulator 10. An additional feature of this transformer design is that because the transformer secondary winding 40 are tightly magnetically coupled to all the primary windings assemblies 34, electron current in the secondary windings 40 implies the existence of electron current in the primary winding assemblies 34 and any series element, which includes all first stage magnetic switches 30a. Although there will always be slight differences in saturation times due to material and assembly tolerances, all the first stage magnetic switches 30a must have saturated before substantial current flows in the secondary windings 40, and before the second stage input capacitors 64 can be charged.

The bipolar pulse transformer 36 is a 1:64 step up transformer electrically configured as many single turn primary windings 63 and a secondary winding 40 which couples to each of the primary windings 63. The voltage appearing across the ends of the secondary winding 40 is the algebraic products of the voltage appearing across the primary windings 63, the number of primary windings 63, and the number of turns in the secondary winding 40. In the preferred embodiment, there are thirty-two primary windings 63 and a two turns in the secondary winding 40 for a voltage step-up ratio of 1:64. The high voltage is constrained to the secondary winding 40 which is totally enclosed by the mechanical structure of the primary windings 63 as shown in detail in FIG. 5. The bipolar transformer 36 has two secondary winding sets, a first secondary winding set 40a which is connected to produce a positive polarity output voltage, and a second secondary winding set 40b which is connected to produce a negative polarity output voltage. As shown in FIG. 1 both secondary winding sets (40a and 40b) are connected to the second stage 42.

As mentioned previously, the second stage 42 is bipolar in operation. The second stage 42 is assembled as two identical stages of magnetic compression, a positive voltage stage 72 which operates at a positive voltage with respect to ground 62, and a negative voltage stage 74, which operates at a negative voltage with respect to ground 62. The positive stage 72 consists of a second stage input capacitor 64 and a second stage magnetic switch 30b connected to the first winding set 40a of the pulse transformer 36 such that a positive output pulse will be produced across the second stage output capacitor 80 when the second stage magnetic switch 30b saturates. Similarly, the negative voltage stage 74 of compression is connected to the second set of secondary windings 40b and consists of an input capacitor 64, a second stage magnetic switch 30b, and an output capacitor 80. The negative voltage stage 74 produces a negative output pulse when the second stage magnetic switch 30b saturates.

The third stage 44, like the first 20 and second stages 42, provides further magnetic compression of the generated pulse. As previously mentioned, the third stage 44 is also bipolar in operation, having a negative voltage stage 82 and a positive voltage stage 84. As in the second stage 42, the negative voltage stage 82 and the positive voltage stage 84 of the third stage 44 each have a magnetic switch 30c, and an output capacitor 90. As is evident from the schematic of FIG. 1 the output capacitors 80 of the positive and negative voltage stages 72 and 74 of the second stage 42 also function as input capacitors for the third stage 44. The output of the third stage 44 is connected directly to the object laser 46. A feature of the third stage 44 design is that it is electrically configured somewhat differently than the second stage 42 in that the output capacitors 90 are not referenced to circuit ground 62. This circuit topology forces both of the third stage magnetic switches 30c to be saturated prior to electron current flow or energy transfer to the output capacitors 90 or the object laser 46. The effect is that slight differences in saturation times (due to tolerances in magnetic material properties, dimensions, etc.) in the second stage magnetic switches 30b and third stage magnetic switches 30c which would normally degrade the output pulse shape and/or rise time, or cause jitter, are eliminated.

As indicated previously, the four magnetic assist inductors 28 share the same physical structure with a common core 91. This arrangement ensures that changes in magnetic flux across the common core 91 are common to each of the magnetic assist inductors 28 so that the separate outputs of the magnetic assist inductors 28 provide essentially identical timing in each of the four low voltage modules 14, even if turn on times and other characteristics of the four main SCR's 26 may vary somewhat.

Table 1, below, lists the relevant type and electrical value information for the electrical components of the best presently known embodiment of the present invention.

TABLE 1

BLOCKING DIODE (22), ENERGY RECOVERY DIODE (56) and CHARGING CIRCUIT BLOCKING DIODE (61)—fast recovery device manufactured by Powerex (Part #R6221230) which has a blocking voltage of 1200 V, a current carrying capacity of 300 A (ave.), and a 500 nS recovery time.

LOW VOLTAGE MODULE INPUT CAPACITORS (24)—0.1 μF, 2000 Volt, Roederstein MKP 1841-410/205 or equivalent.

MAIN SCR's (26)—Westcode Part #R400CH12 or equivalent.

MAGNETIC ASSIST INDUCTORS (28)—4 sets of turns (hollow copper tubing for water cooling) wound on a NiZn ferrite toroidal core, 4" inner diameter × 6" outer diameter × 0.5" thick (material type Ceramic Magnetics Type CMD 5005; or equivalent).

FIRST STAGE MAGNETIC SWITCH (NON-LINEAR INDUCTOR) (30a)—Oil filled, single turn coaxial structure magnetic switch wound with Allied Corp. Metglas Type 2605 SC magnetic material insulated turn to turn with 0.1 mil Mylar plastic film.

FIRST STAGE INPUT CAPACITOR (32)—0.1 μF, 1600 Volt, Roederstein KP1836-410/135 or equivalent.

BIPOLAR PULSE TRANSFORMER (36)—1:64 step up bipolar Primary Windings—32 mandrels Two Sets of Secondary Windings—A metal tube disposed within the primary mandrels connected to a metal rod disposed within the metal tube.

Transformer Core—Allied Corp. Metglas Type 2605 SC magnetic material spirally wrapped around each primary mandrel to form a magnetic core of toroidal geometry.

POWER SUPPLY (50)—300 to 650 Volt 35 kW.

FIRST SCR (52)—Westcode, Part #R325CH14.

ENERGY RECOVERY INDUCTOR (54) and CHARGING INDUCTOR (58)—3/16" diameter copper tubing (for water flow) wound on commercially available powdered iron toroidal cores.

ZENER DIODE (60)—International Rectifier 100 V and 150 V 500 Watt zener diodes, Part # 500PZA100B and 500PZA150B.

SECOND STAGE INPUT CAPACITORS (64), THIRD STAGE INPUT CAPACITORS (second stage output capacitors) (80), and THIRD STAGE OUTPUT CAPACITORS (90)—560 pF, 50 kV, TDK UHU-10A ceramic capacitor or equivalent.

SECOND STAGE MAGNETIC SWITCH 30b and THIRD STAGE MAGNETIC SWITCH 30c—Single turn coaxial structure with ferrite toroidal core, core material Ceramic Magnetics Type CN20 NiZn ferrite or equivalent. Second stage comprised of four structures. The third stage comprised of a single structure.

Figure 2:
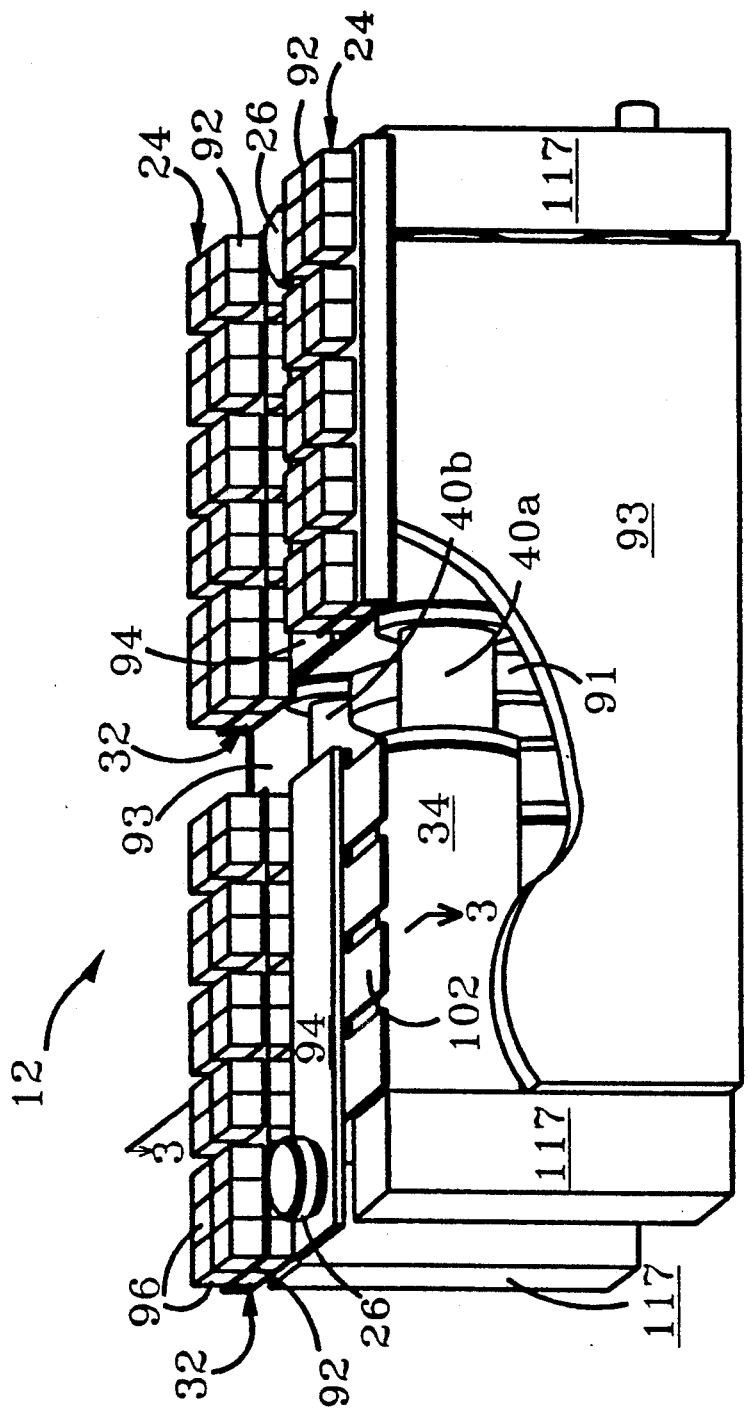
FIG. 2 is a partially cut away perspective view of the low voltage assembly according to the present invention.

A perspective view of the low voltage assembly 12 of the preferred embodiment 10 of the present invention is shown in FIG. 2, with one (of a total of four in the best presently known embodiment 10 of the present invention) of capacitor banks 92 removed and a portion of one of two water cooled side cold plates 93 cut away. Each of the main SCR's 26 is attached to a water cooled input cold plate 94 (only two of the four main SCR's 26 is shown in FIG. 2) for carrying heat away therefrom. On each side of the input cold plates 94 are two of the capacitor banks 92, one of which is the physical manifestation, in the best presently known embodiment 10 of the present invention, of the low voltage module input capacitors 24 (shown electrically in FIG. 1) and the first stage input capacitors 32. As can be seen in the view of FIG. 1, the capacitor banks 92 are each actually two arrays of twenty two individual capacitors 96 connected in parallel.

Each of the main SCR's 26 is connected to a magnetic assist inductor 28. The magnetic assist inductor 28 in the preferred embodiment is four sets of turns around the common magnetic assist core 91. The lead lengths from each of the SCR's 26 to the magnetic assist inductor 28 are the same so that the total loop inductance for each main SCR 26 is the same.

Figure 3:
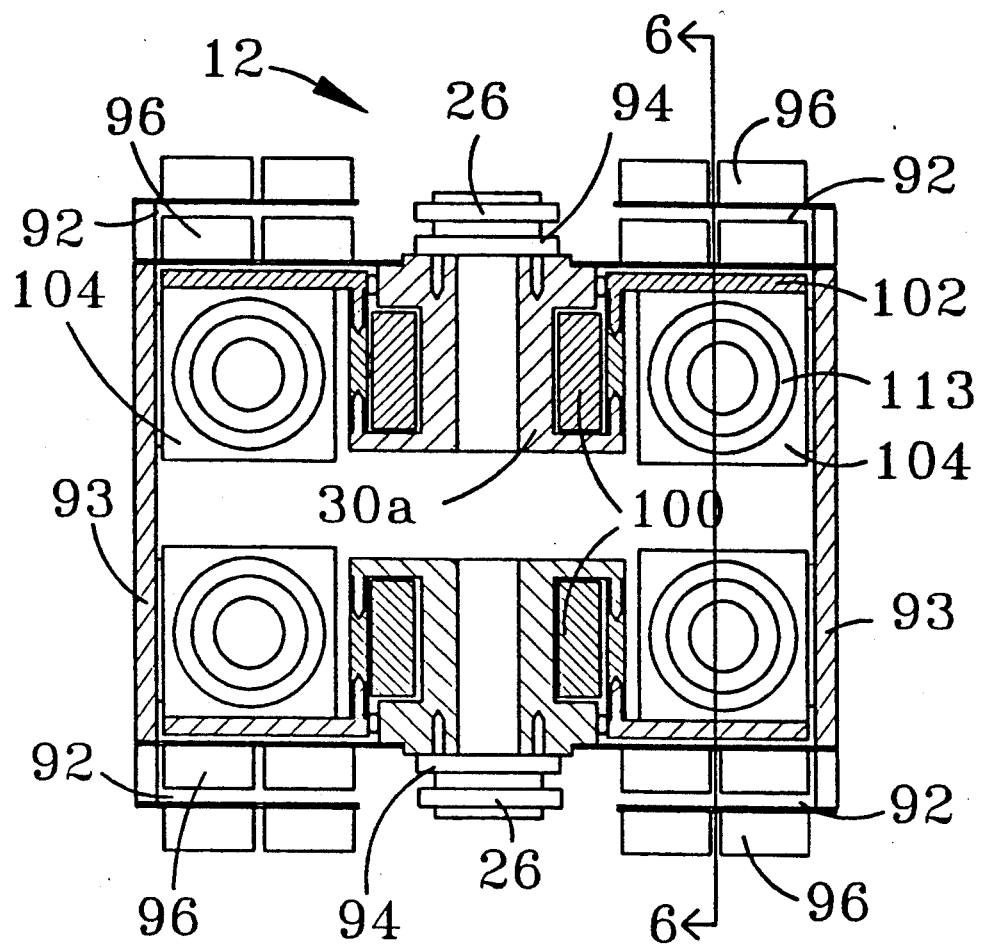
FIG. 3 is side cross sectional view of the low voltage assembly taken along line 3—3 of FIG. 2.

A side cross section of the low voltage assembly 12 taken along line 3—3 of FIG. 2 is shown in FIG. 3. Two of the four first stage magnetic switches 30a can be seen in the view of FIG. 3. Each of the first stage magnetic switches 30a is a coaxial structure surrounded by a toroidal shaped winding of magnetic material 100, and is attached to one of the input cold plates 94 shared with a main SCR 26. Each first stage magnetic switch 30a outputs to a transformer drive plate 102 which connects to the inputs of the primary winding assemblies 34 of the bipolar pulse transformer 36.

The bipolar pulse transformer 36 is essentially two separate transformers of opposite polarity with a common ground connection for one end of each secondary winding (40a and 40b). The physical structure of one polarity of the bipolar transformer 36 is set forth in the partially cut away perspective views of FIGS. 4, 5 and 6. As shown in FIG. 5, each primary winding 63 is in the form of an electrically conductive mandrel 104 which mechanically resembles a spool with a large central hole 105. Electrically, each mandrel 104 is single turn primary winding 63 With a ground side 108 and a drive side 110 which, with spool body 111, creates a single turn around a toroidal core of the magnetic material 112 which is spirally wound onto the spool body 111. The ground and drive ends of adjacent mandrels (108 and 110) are mechanically attached to each other but remain electrically insulated by mandrel o-rings 113. As shown in the cutaway view of FIG. 5, the turns of the secondary winding 40 are formed of a concentric rod 114 and tube 115 located on the centerline of the mandrels 104 (the connections and interconnections are discussed in detail in the description of FIG. 6). A primary winding assembly 34 consists of four primary windings 63 as shown in FIG. 5 and two such primary windings assemblies 34 are located in a single low voltage module 14. The four drive sides 110 in each primary winding assembly 34 are electrically connected to each other (eight total in a low voltage module 14) as are the ground sides 108: i.e. the primary windings 63 are connected in parallel.

As shown in FIG. 4, two primary winding assemblies 34 are physically joined by a link mandrel 116 forming a long cylindrical structure. Two such structures are mechanically joined at the ends with two pressurized boxes 117 (there are four pressurized boxes 117 in total in the best presently known embodiment 10 of the present invention). The two turns of the secondary winding 40 are shown extending out of the primary winding assemblies 34 into the pressurized boxes 117. FIG. 4 shows a simplified assembly representing one polarity of the bipolar pulse transformer 36. As shown in FIG. 2 the two sets of windings 40a and 40b that make up the secondary winding 40 are positioned within the low voltage assembly 12 (the secondary windings, 40a and 40b, themselves are not visible).

Figure 6:
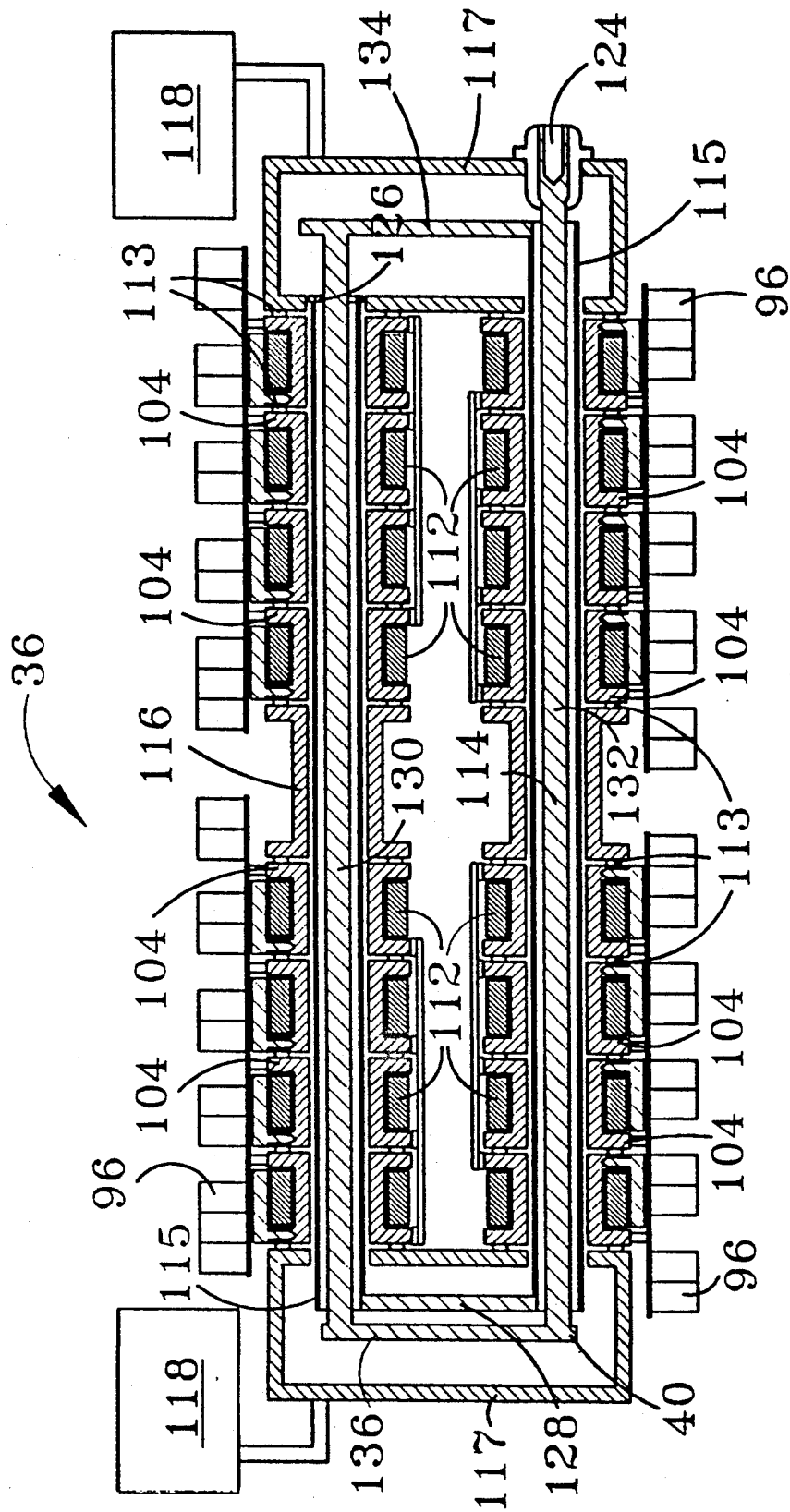
FIG. 6 is a cross sectional view of one set of secondary windings taken along line 6—6 of FIG. 3.

The transformer 36 structure is shown in FIG. 6 in a cross section taken along line 6—6 of FIG. 3. As shown in FIG. 6 a pressure source 118 provides high pressure air to the pressurized boxes 117. The primary winding assemblies 34, link mandrels 116, pressurized boxes 117, and interposed o-rings 113 create an airtight structure in which the secondary winding 40 is situated. Air at high pressure (80–100 psi) has a higher voltage breakdown strength than air at atmospheric pressure and so serves in this configuration as the high voltage dielectric between the transformer primary windings assemblies 34 and secondary winding 40.

In the preferred embodiment the secondary winding 40 are composed of a tube 115 and a rod 114 which is centered within the holes 105 of the primary winding mandrels 104. (See also FIG. 5.) High voltage appears across the output 124 of the secondary winding 40 and is directly proportional to the number of primary winding assemblies 34 that are linked. Either voltage polarity can be obtained by grounding the appropriate end of the secondary winding 40. As shown in FIG. 4 and 6 the transformer primary winding assemblies 34, shown as four sets of four mandrels 104, form a rectangular loop with the transformer primary winding assemblies 34 and link mandrels 116 positioned on the long legs of the loop and the pressurized boxes 117 forming the short legs of the loop.

The first turn of the secondary winding 40 is configured as two connected tubes 115, one tube grounded at a tube ground end 126. As shown in FIG. 6 each tube 115 traverses the long legs of the rectangular loop within the mandrels 104 and are connected to each other by a tube-tube link 128 on a short leg of the loop inside the pressurize box 117. The second turn of the secondary winding 40 is configured as a first rod 130 and a second rod 132 concentric with the tubes 115 of the first turn, which traverse the same rectangular loop. At one end of the transformer 36, within the pressurized box 117, the first rod 130 is connected to the first turn by a tube-rod link 134. At the opposing end, within the other pressurized box 117, the first 130 and second rods 132 are connected by a rod-rod link 136. The secondary winding output 124 extends through the pressurized box 117 holding the tube-rod link 134. This output 124 is connected to the second stage 42.

FIG. 3 sets forth the cooling system for the transformer 36. The two side cold plates 92 are each attached to four sets of primary winding assemblies 34 to carry heat away therefrom.

Figure 7:
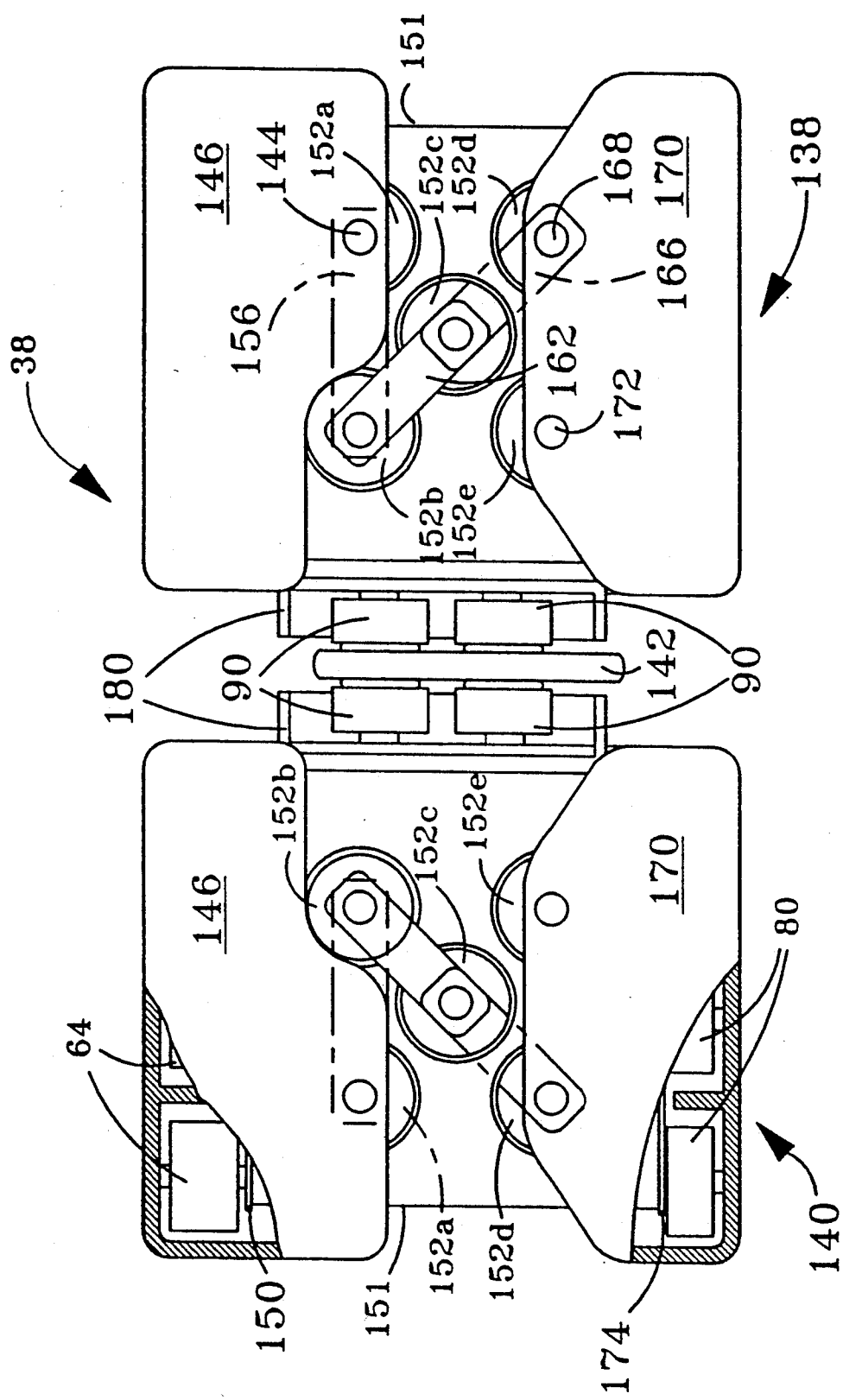
FIG. 7 is a cut away side view of the output assembly.
Figure 8:
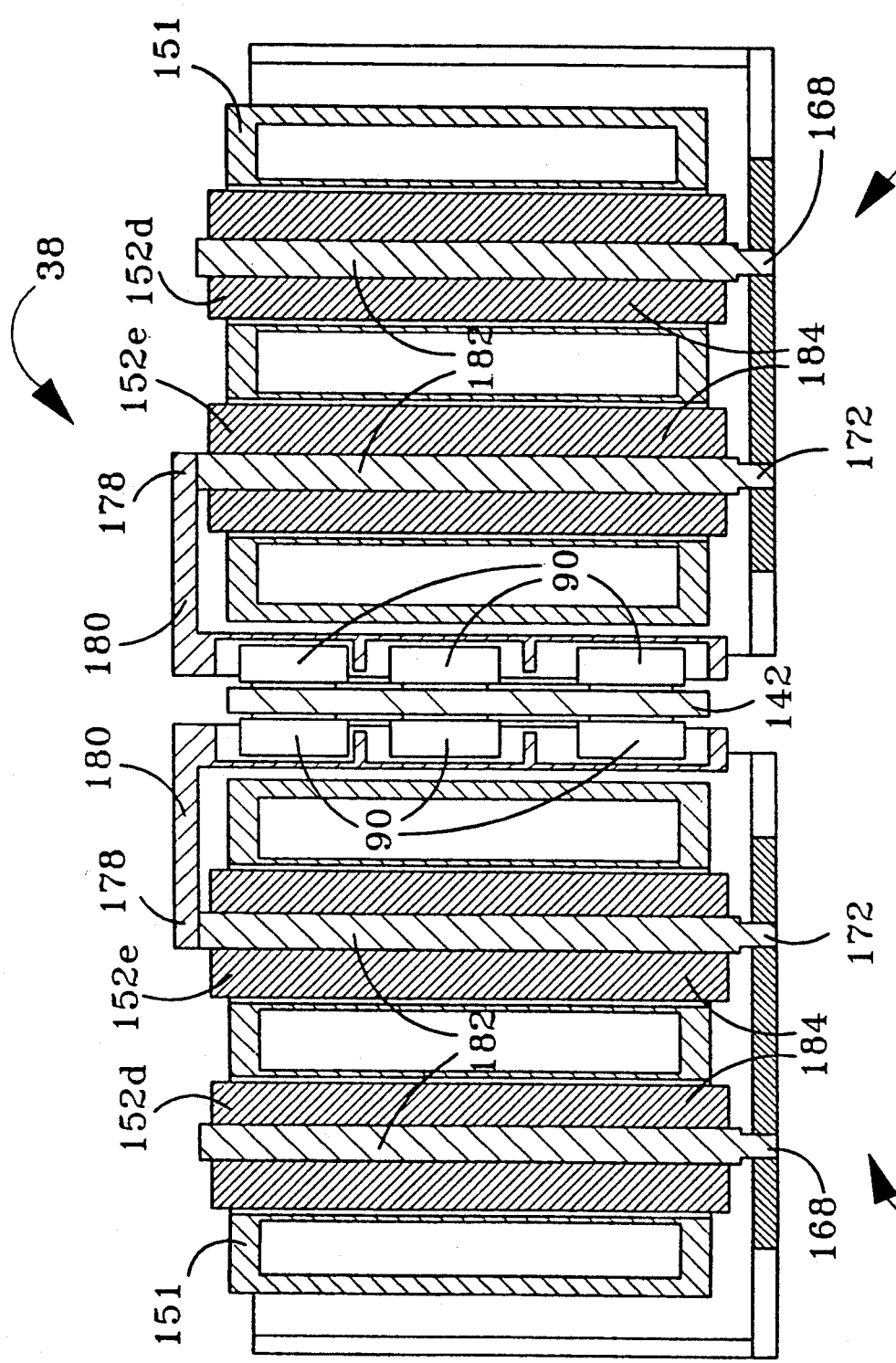
FIG. 8 is a top cross sectional view of the output assembly.

As mentioned previously, in the preferred embodiment, the second and third stages (42 and 44) are combined in a single output assembly 38. This assembly is depicted in a partial cut away front view in FIG. 7, and top cross sectional view in FIG. 8. As shown in FIG. 7 and FIG. 8 the output assembly 38 includes a positive voltage section 138 and a negative voltage section 140 for holding the positive and negative voltage stages, respectively, of the bipolar second and third stages (42 and 44). The two sections (138 and 140) are mirror images of each other, mirrored about an output assembly cooling plate 142.

As shown in FIG. 7 the positive voltage section 138 of the output assembly 38 includes a second stage input 144, including a second stage connector plate 146. The second stage connector plate 146 creates a common input to the second stage magnetic switch 30b and the second stage input capacitor 64. As shown in FIG. 7 the second stage input capacitor 64 is actually a three-by-three block of capacitors connected in parallel between the connector plate 146 and a top ground plate 150 Which ties together the two waterproof boxes 151 and to which system ground 62 is connected.

As is also shown in FIG. 7, in the preferred embodiment 10, the output assembly 38 includes ten core structures 152 (five for the positive voltage section 138 and five for the negative voltage section 140). In both voltage sections (138 and 140) the second magnetic switch 30b has four core structures 152 beginning with a first core structure 152a, which is connected by a first connector 156 (shown in "ghost" view in FIG. 7) in the rear of the output assembly to the second core structure 152b. The second core structure 152b is connected to the third core structure 152c by a second connector 162 at the front of the output assembly 38. The third core structure 152c is connected to the fourth core structure 152d by a third connector 166 in the rear of the output assembly 38. The second stage magnetic switch 30b terminates at the second stage output 168.

A third stage connector plate 170 ties the output of the second stage 168 with a third stage input 172, including the third stage input capacitors 80. The third stage connector plate 170, like the second stage connector plate 146 curves from the front of the output assembly 38. As shown in FIG. 7, the third stage input capacitor 80, like the second stage input capacitors 64 is a three-by-three block of capacitors connected in parallel. The third stage input capacitor so is sandwiched between the third stage connector plate 170 and a bottom ground plate 174 which mechanically and electrically serves the same function as top ground plate 150.

The third stage magnetic switch 30c is the fifth core structure 152e. As shown in FIG. 8, at the rear of the output assembly 38 the fifth core structure 152e ends in the laser modulator output 178. An output connector plate 180 ties the laser modulator output 178 with the output capacitors 90. As shown in FIG. 7 and FIG. 8 the output capacitors 90 are, physically, two sets of six capacitors, arranged in a two-by-three block, each set connected in parallel. The cross sectional view shows that each core structure 152 is composed of a central conductor surrounded by a toroidal core of magnetic material 184.

The cooling system for the output assembly 38 is shown in the cross section of FIG. 8. The core structures 152 are contained within waterproof boxes 151. Water flows within the boxes 151 cooling the cores as well) as second, and third stage input capacitors (64 and 86). The output capacitors 90 are cooled by the output assembly cooling plate 142. In addition, it is necessary for voltage holding that the entire output assembly 38 by located in a box and submersed in a high voltage dielectric fluid.

Various modifications may be made to the invention without altering its value or scope. All of the above is only one example of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The improved laser modulator of the present invention is designed for use as a laser modular in applications where both a high energy output and a long life and reliability are required. It is expected by the inventors that the present inventive improved laser modulator 10 mill meet or exceed the reliability of prior art modulators using fluorocarbon based coolants, while avoiding the use of such environmental contaminants.

The improved laser modulator 10 may be utilized in essentially any application wherein conventional prior art high power laser modulators are used.

We claim:

1. A magnetic compression laser driving assembly, comprising:
   a first compression stage including a plurality of first stage magnetic switches, each of said magnetic switches having associated therewith a magnetic assist coil with a core common to each of the magnetic assist coils.

2. The magnetic compression laser driving assembly of claim 1, wherein:
   the quantity of first stage magnetic switches is four.

3. The magnetic compression laser driving assembly of claim 1, wherein:
said first stage magnetic switches are connected such that the energy output of all of said first stage magnetic switches is electrically summed.

4. The magnetic compression laser driving assembly of claim 1, and further including:
a second compression stage coupled to said first compression stage through a step up transformer.

5. The magnetic compression laser driving assembly of claim 4, wherein:
the second compression stage is bipolar.

6. The magnetic compression laser driving assembly of claim 5, and further including:
a third compression stage directly electrically coupled to the second compression stage.

7. The magnetic compression laser driving assembly of claim 6, wherein:
the third compression stage is bipolar.

8. The magnetic compression laser driving assembly of claim 1, wherein:
said first stage magnetic switches are housed together in a low voltage assembly.

9. The magnetic compression laser driving assembly of claim 8, wherein:
the low voltage assembly has a cold plate on the exterior thereof with at least some of the components of the first compression stage mounted thereon.

10. The magnetic compression laser driving assembly of claim 9, wherein:
the cold plate is cooled by water being caused to flow therethrough.

11. The magnetic compression laser driving assembly of claim 9, wherein:
each of said first stage magnetic switches is affixed to the cold plate.

12. The magnetic compression laser driving assembly of claim 1, wherein:
each of said first stage magnetic switches includes a toroidal shaped winding of magnetic material.

13. The magnetic compression laser driving assembly of claim 6, wherein:
the second compression stage and the third compression stage are housed together in an output assembly.

14. The magnetic compression laser driving assembly of claim 13, wherein:
the output assembly is at least partially enclosed in a dielectric fluid filled housing.

15. A magnetic compression laser driving assembly, comprising:
a plurality of magnetic compression stages connected in series wherein a first of said plurality of magnetic compression stages includes a plurality of first stage magnetic compression switches connected such that the energy output of all of said first stage magnetic compression stages is electrically summed.

16. The magnetic compression laser driving assembly of claim 15, wherein:
each of said first stage magnetic compression switches includes a magnetic switch inductor with an associated magnetic assist input inductor; and
all of said magnetic assist input inductors share a common core.

17. The magnetic compression laser driving assembly of claim 16, wherein:
each of said first stage magnetic compression switches is housed in a first stage housing having a cold plate covering at least a portion thereof through which water may be pumped for cooling said first stage magnetic compression switch.

18. The magnetic compression laser driving assembly of claim 16, wherein:
a second and a third of said plurality of magnetic compression stages are housed in an output assembly housing at least a portion of which is pressurized.

19. The magnetic compression laser driving assembly of claim 18, wherein:
the second and third magnetic compression stages are bipolar.

* * * * *